(12) United States Patent
Boyd et al.

(10) Patent No.: US 6,910,240 B1
(45) Date of Patent: Jun. 28, 2005

(54) WAFER BEVEL EDGE CLEANING SYSTEM AND APPARATUS

(75) Inventors: John M. Boyd, Atascadero, CA (US); Fred C. Redecker, Fremont, CA (US); James P. Garcia, Santa Clara, CA (US)

(73) Assignee: Lam Research Corporation, Fremont, CA (US)

(*) Notice: Subject to any disclaimer, the term of this patent is extended or adjusted under 35 U.S.C. 154(b) by 144 days.

(21) Appl. No.: 10/321,688

(22) Filed: Dec. 16, 2002

(51) Int. Cl.[7] ............................................. A47L 25/00
(52) U.S. Cl. ............................ 15/77; 15/102; 15/88.2
(58) Field of Search ......................... 15/77, 88.2, 102; 134/902

(56) References Cited

U.S. PATENT DOCUMENTS

| | | | |
|---|---|---|---|
| 5,725,414 A | * 3/1998 | Moinpour et al. | 451/41 |
| 5,729,856 A | * 3/1998 | Jang et al. | 15/88.1 |
| 5,861,066 A | 1/1999 | Moinpour et al. | |
| 6,092,253 | * 7/2000 | Moinpour et al. | 15/77 |
| 6,230,753 | * 5/2001 | Jones et al. | 134/1.3 |
| 6,550,091 | * 4/2003 | Radman et al. | 15/77 |
| 2004/0049870 | * 3/2004 | Tolles et al. | 15/77 |

* cited by examiner

Primary Examiner—Robert J. Warden, Sr.
Assistant Examiner—Laura C Cole
(74) Attorney, Agent, or Firm—Martine Penilla & Gencarella, LLP

(57) ABSTRACT

A system, method and apparatus for cleaning a substrate edge includes a substrate supporting device for substantially supporting a substrate in a selected plane. The substrate has a circular shape, a circumferential edge, a front side and a back side. The edge has a bevel shaped cross-section. The substrate edge cleaning apparatus also includes a first edge cleaning roller that has an open curved scrubbing surface in contact with at least part of a first portion the edge of the substrate. An interaction of the first edge cleaning roller with the part of the first portion can also be adjusted dynamically.

9 Claims, 14 Drawing Sheets

WAFER BEVEL EDGE CLEANING SYSTEM AND APPARATUS

BACKGROUND OF THE INVENTION

1. Field of the Invention

The present invention relates generally to semiconductor wafer cleaning, and more particularly, to methods, systems and apparatus for cleaning wafer edges before, during and after fabrication operations.

2. Description of the Related Art

In the semiconductor chip fabrication process, it is well known that there is a need to clean a semiconductor substrate (i.e., wafer) where a fabrication operation has been performed that leaves unwanted residuals on the surface of the wafer. Examples of such a fabrication operation include plasma etching, material depositions and chemical mechanical planarization (CMP). CMP is commonly performed on both dielectric materials and conductive materials, e.g., such as oxide and copper. If particles or films are left on the surface of the wafer for subsequent fabrication operations, the unwanted residual particles or material may cause, among other things, defects such as scratches on the wafer surface and inappropriate interactions between metallization features or with subsequent lithography operations. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residue on the surface of the wafer.

FIG. 1A shows a high level schematic diagram of a wafer cleaning system 50. The cleaning system 50 typically includes a load station 10 where a plurality of wafers in a cassette 14 may be inserted for cleaning through the system. Once the wafers are inserted into the load station 10, a wafer 12 may be taken from the cassette 14 and moved into a brush box one 16a, where the wafer 12 is scrubbed with selected chemicals and water (e.g., de-ionized (DI) water). The wafer 12 is then moved to a brush box two 16b. After the wafer has been scrubbed in the brush boxes 16, the wafer is moved into a spin, rinse, and dry (SRD) station 20 where DI water is sprayed onto the surface of the wafer and spun to dry. During the rinsing operation in the SRD station. After the wafer has been placed through the SRD station 20, the wafer is moved to an unload station 22.

FIG. 1B shows a simplified view of a cleaning process performed in brush box one 16a. In brush box one 16a, the wafer 12 having a top surface 12a (i.e., the active side) is inserted between a top brush 30a and a bottom brush 30b. The wafer 12 is capable of being rotated by holding and driving rollers (not shown) and the rotating brushes 30a and 30b to adequately clean the entire top and bottom surfaces of the wafer. After typical CMP operations, a wafer is placed into the cleaning station 50. In brush box one 16a, the top brush 30a and the bottom brush 30b are preferably concentrated with a cleaning chemical, which is received from a source 32 or other sources controlled by a chemical/DI water dispensing system (not shown).

A common fabrication operation includes the deposition of metals over previously formed dielectric features, which is commonly done in damascene and dual-damascene processes. As is generally defined, damascene and dual-damascene processes include the formation of features, such as interconnect lines and vias into dielectric materials, filling the dielectric features with conductive material, e.g., such as copper, and then performing CMP operations to remove the excess metallization material. The metal material can be formed over the wafer using various techniques, such as, for example, deposition, electroplating, sputtering, and the like.

In either case, the formation of metal material may generate excess beading around the periphery of the wafer. It is also a common operation to perform standard cleaning operations after such metal deposition operations, to ensure that the excess metal and loose particles and contaminants are removed from the wafer before engaging in further processing.

A problem typically experienced is that standard brush scrubbing and edge cleaning techniques fail to clean and remove the metal edge beading and loose particles from wafer edge surfaces sufficiently well from the upper portion of the wafer surface in the edge exclusion zone between 1 and 3 millimeters from the wafer bevel edge. One approach to edge cleaning was described in U.S. Pat. No. 5,861,066 entitled "Method and Apparatus for Cleaning Edges of Contaminated Substrate." This U.S. Patent is incorporated herein by reference. Although this apparatus does well at cleaning the immediate edge of the wafer, other portions of the wafer edge in which beading and particulates adhere are most commonly not sufficiently addressed. That is, although sufficient center cleaning is performed using the brushes 30 of FIG. 1B, not enough mechanical scrubbing is performed directly on the top and bottom surface areas near the edge. Consequently, residue will remain even after repeated conventional brush cleaning.

FIG. 1C shows another prior art wafer brush-box 60 with a double-sided wafer edge cleaner 65. The brush-box 60 includes a drive roller 61 that rotates in a direction 62 that drives the wafer 12 in a direction 63, and a stator roller 68 that maintaines the wafer contact with the drive roller 61. The edge cleaner 65 cleans the edge zones 66 of both the front side and the back side of the wafer 12 and the bevel edge 74 of the wafer 12, typically rotating at a different speed than the drive roller 61. The edge cleaner 65 can be a stationary, U-shaped scrub brush 70 as shown in detail in FIG. 1D. The stationary, U-shaped scrub brush 70 includes a compressible scrubbing pad 72 that the bevel edge 74 of the wafer 12 and the front side and back side of the wafer 12 compresses as the wafer 12 is pressed into the scrubbing pad 72. The edge cleaner 65 can also be a rotating, grooved edge cleaning roller 80 as shown in detail in FIG. 1E. If the edge cleaner 65 is a rotating, grooved edge cleaning roller 80 can rotate in a direction 67 as shown in FIG. 1C. The grooved edge cleaning roller 80 includes a compressible scrubbing pad 82 that the wafer 12 compresses as the wafer is pressed into the scrubbing pad 82.

Unfortunately, the double-sided wafer edge cleaner 65 has several shortfalls. First, the double-sided wafer edge cleaner 65 cannot provide a uniform edge cleaning process as shown in FIG. 1F. The inner edge of the cleaned zone is shown by line 90. The cleaning edge 90 is erratic, in part, because the compressible scrubbing pad 72, 82 compresses and rebounds (i.e., extends) as the double-sided wafer edge cleaner 65 passes along the bevel edge 74 of the wafer 12.

Another problem with the double-sided wafer edge cleaner 65 is that the scrubbing pad 72, 82 cannot be cleaned or rinsed very well due to the deep grooved shape and the compressed nature of the scrubbing pad 72, 82. As a result contaminants and debris can become lodged deep within the scrubbing pad 72, 82 and contaminants can be transferred from one wafer to the next wafer and debris removed from one wafer can damage a subsequent wafer.

The double-sided wafer edge cleaner 65 also does not provide for independent control of front side and back side edge exclusion cleaning so that differential cleaning on the front side and back side of the wafer can occur, i.e., the double-sided wafer edge cleaner 65 does not allow independent control of the cleaning width on the front side and the back side of the wafer 12. The double-sided wafer edge cleaner 65 can also pinch or bind the wafer 12 in the deep pocket of the scrubbing pad 72, 82. Binding can damage the wafer 12 or result in less effective cleaning of the bevel edge 74 and the edge zone 66 of the wafer 12. Further, systematic wear of the scrubbing pad will change the cleaning performance and effectiveness of the scrubbing pad over time, reducing the bevel edge contact characteristics or the front and back side edge exclusion cleaning.

In view of the foregoing, there is a need for a double sided substrate edge cleaning system, method and apparatus that provides an improved substrate edge cleaning mechanism that provides improved control of front side and back side edge cleaning, and that does not bind the substrate being cleaned.

SUMMARY OF THE INVENTION

Broadly speaking, the present invention fills these needs by providing an improved substrate edge cleaning mechanism. It should be appreciated that the present invention can be implemented in numerous ways, including as a process, an apparatus, a system, computer readable media, or a device. Several inventive embodiments of the present invention are described below.

One embodiment includes a substrate edge cleaning apparatus that includes a substrate supporting device for substantially supporting a substrate in a selected plane. The substrate having a circular shape, a circumferential edge, a front side and a back side. The edge having a bevel shaped cross-section. The substrate edge cleaning apparatus also includes a first edge cleaning roller that has an open curved scrubbing surface in contact with at least part of a first portion the edge of the substrate. The interaction of the edge cleaning apparatus with the part of the first portion can also be adjusted dynamically.

The first portion can extend between an exclusion zone on one of the front side and the back side of the substrate to a point substantially beyond a center line of the substrate but not on an opposing side of the substrate.

The substrate edge cleaning apparatus can also include a second edge cleaning roller having an open curved scrubbing surface in contact with at least part of a second portion the edge of the substrate.

The first portion can extend between a first exclusion zone on the front side of the substrate to a point substantially beyond a center line of the substrate but not on the back side of the substrate. The second portion can extend between a second exclusion zone on the back side of the substrate to a point substantially beyond a center line of the substrate but not on the front side of the substrate. The interaction of the edge cleaning apparatus with the part of the first portion and the part of second portion can be adjusted dynamically.

The first edge cleaning roller can be coupled to a drive mechanism capable of driving the first edge cleaning roller causing the first edge cleaning roller to have a differential tangential velocity relative to the edge of the substrate.

The first edge cleaning roller can be coupled to an actuator capable of dynamically adjusting a location of the first edge cleaning roller in at least one of an X-axis and a Z-axis, relative to the substrate.

The substrate edge cleaning apparatus can also include a control system that includes a recipe. The recipe can define multiple parameters of the first edge cleaning roller. The parameters can include the location of the first edge cleaning roller and the rotation of the first edge cleaning roller.

The substrate edge cleaning apparatus can also include at least one surface cleaning roller in contact with at least one of the front side and the back side of the substrate.

The substrate edge cleaning apparatus can also include at least one nozzle directed toward a side of the first edge cleaning roller opposite from the substrate.

Another embodiment includes a method of cleaning an edge of a substrate. The method includes contacting at least a part of a first portion of a bevel edge of the substrate with a first edge cleaning roller without contacting a second portion of the bevel edge of the substrate. The first portion can extend from between an exclusion zone on a first side of the substrate to a point substantially beyond a center line of the substrate but not on a second side of the substrate. The second portion can include the second side of the substrate. The substrate is rotated and the first edge cleaning roller can be rotated. The first edge cleaning roller can also be rinsed. Rinsing the first edge cleaning roller can include applying a rinsing agent to a portion of the first edge cleaning roller that is not in contact with the substrate. A location of the part of the first portion on the bevel edge of the substrate can be adjusted.

The method can also include contacting at least a part of a third portion of a bevel edge of the substrate with a second edge cleaning roller without contacting a fourth portion of the bevel edge of the substrate. The third portion extending between an exclusion zone on the second side of the substrate to a point substantially beyond a center line of the substrate but not on the first side of the substrate. The fourth portion can include the first side of the substrate.

The method can also include adjusting a location of the part of the first portion on the bevel edge of the substrate and adjusting a location of the part of the third portion on the bevel edge of the substrate. The location of the part of the first portion can be adjusted independent of the location of the part of the third portion.

Another embodiment includes a substrate cleaning system that includes a cleaning station. The cleaning station can include a substrate supporting device to substantially support the substrate in a selected plane and a first edge cleaning roller having an open curved scrubbing surface in contact with at least part of a first portion the edge of the substrate.

The fist portion can extend between an exclusion zone on one of the front side and the back side of the substrate to a point substantially beyond a center line of the substrate but not on an opposing side of the substrate.

The substrate supporting device can include two side scrubbing brushes that support the substrate between the two side scrubbing brushes.

The substrate supporting device can include two or more edge rollers in contact with the edge of the substrate, the two or more edge rollers and the first edge cleaning roller are distributed around a circunference of the substrate to support the substrate.

Separating the edge cleaning rollers allow improved and more effective edge cleaning over the prior art edge cleaning systems, methods and apparatus. The dynamic adjusting of the individual, separate edge cleaning rollers also provides improved and more precise control of the cleaning process than the prior art edge cleaning systems, methods and apparatus.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved and more effective and more flexible wafer edge cleaning system, method and apparatus will now be described. It will be apparent to those skilled in the art that the present invention may be practiced without some or all of the specific details set forth herein.

Wafer edge cleaning systems and methods are very important to the ultimate quality of the resulting semiconductor. One embodiment includes an edge cleaning system, method and apparatus that have separate cleaning of the front side edge zone and the back side edge zone. Separating and decoupling the front side edge zone cleaning from the back side edge zone cleaning allows for a more flexible and effective bevel edge and edge zone cleaning process and also allows more effective control of the bevel edge and edge zone cleaning process.

Figure 1A:
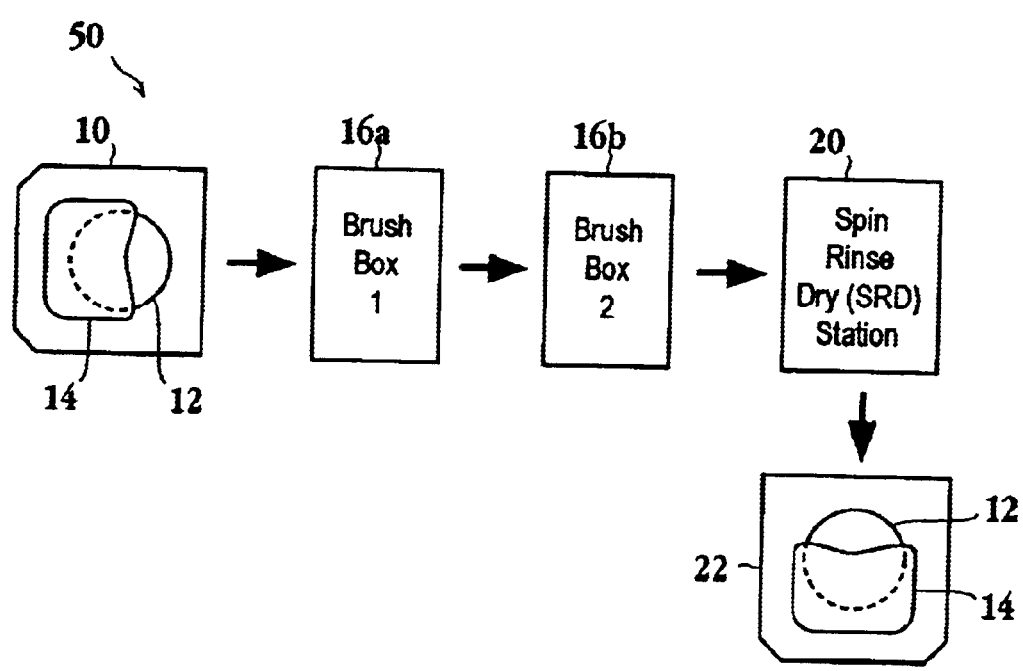
FIG. 1A shows a high level schematic diagram of a wafer cleaning system.
Figure 1B:
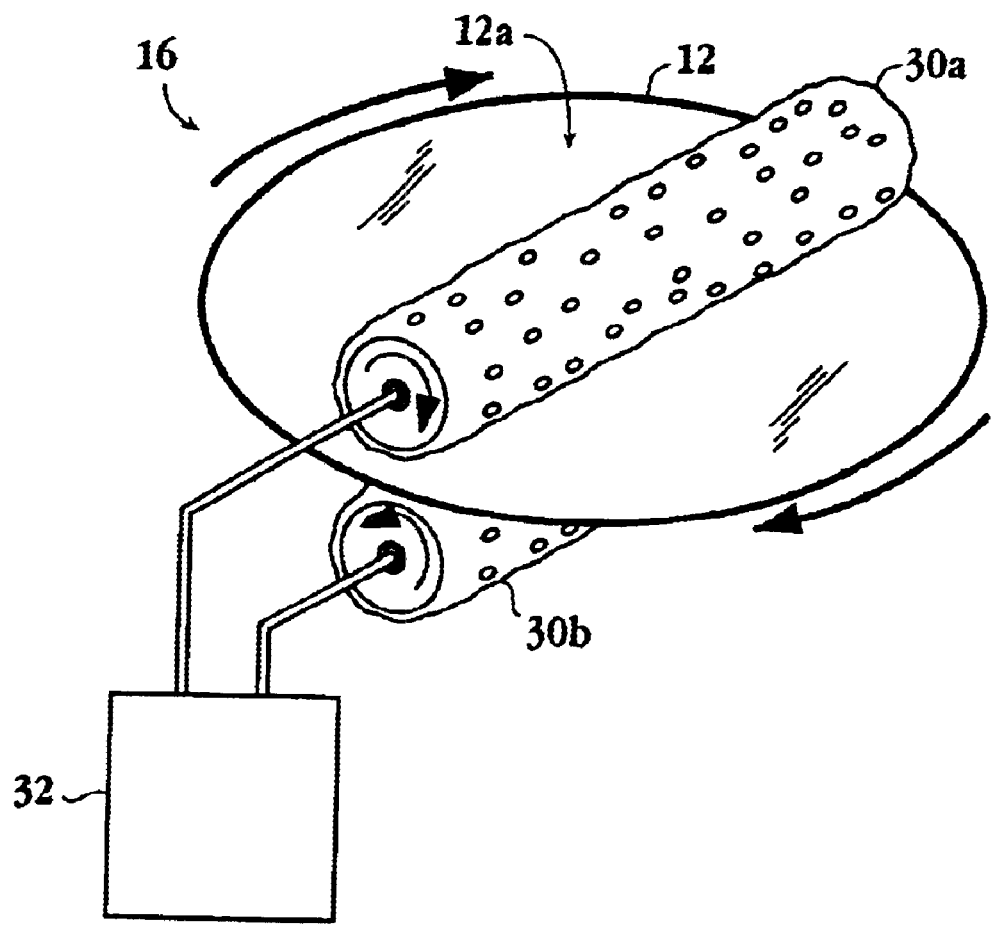
FIG. 1B shows a simplified view of a cleaning process performed in brush box one.
Figure 1C:
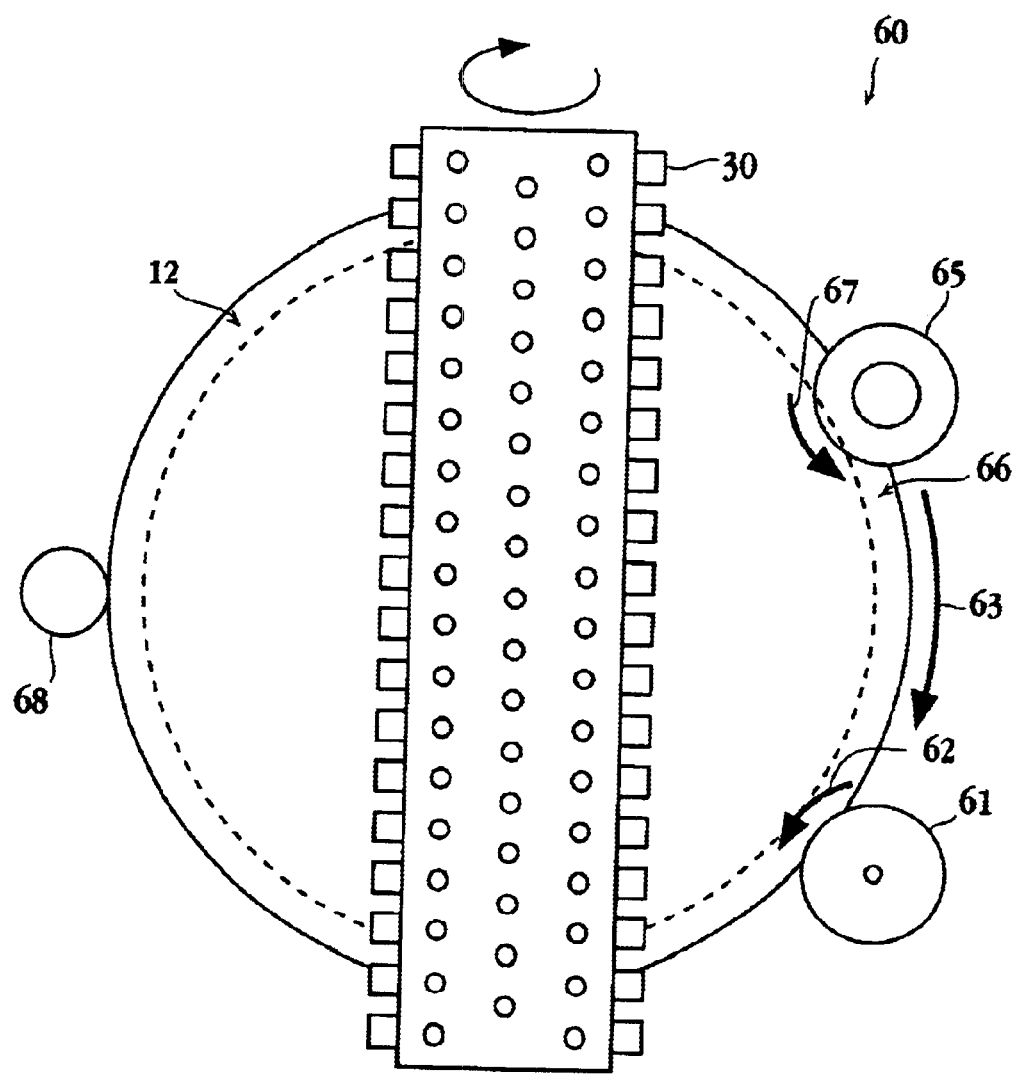
FIG. 1C shows another prior art wafer brush-box with a double-sided wafer edge cleaner.
Figure 1D:
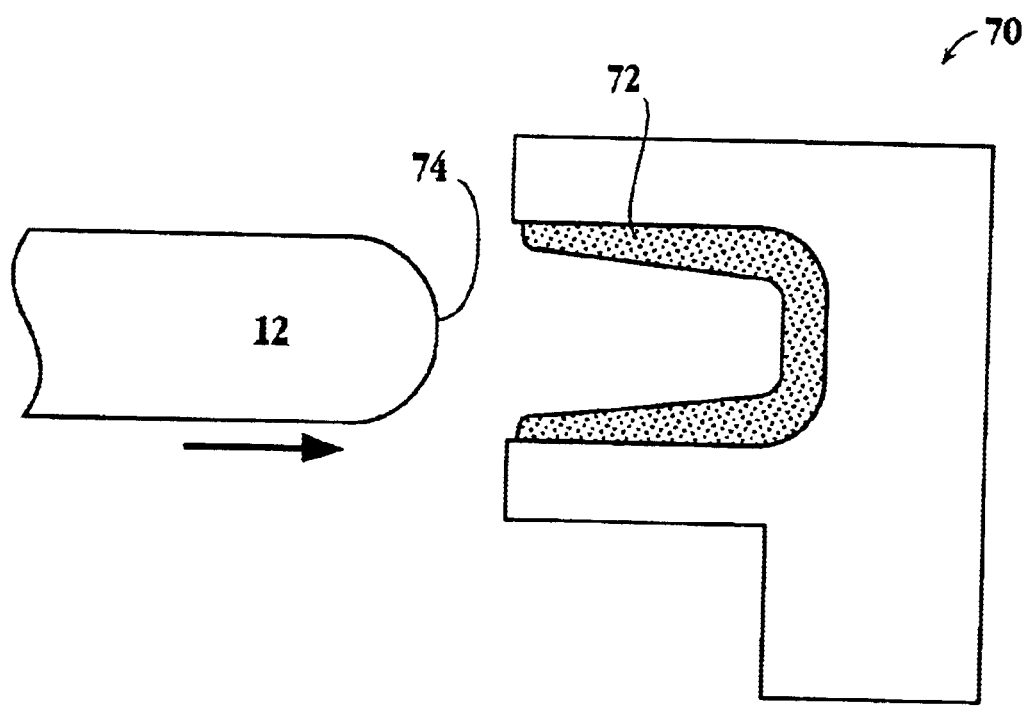
FIG. 1D shows a prior art U-shaped scrub brush edge cleaner.
Figure 1E:
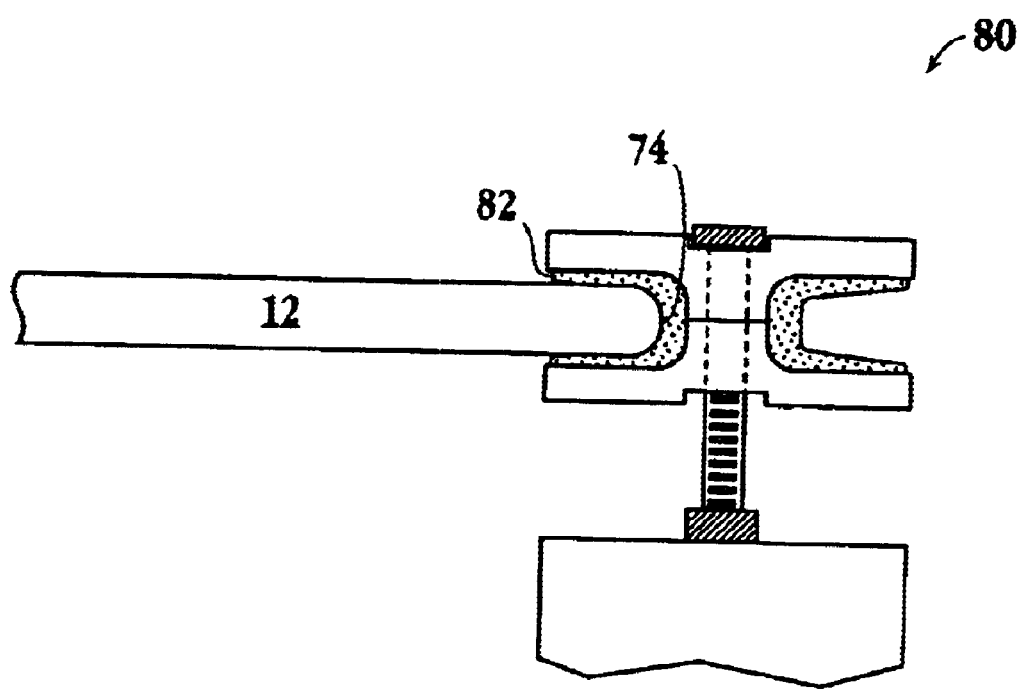
FIG. 1E shows a prior art grooved edge cleaning roller.
Figure 1F:
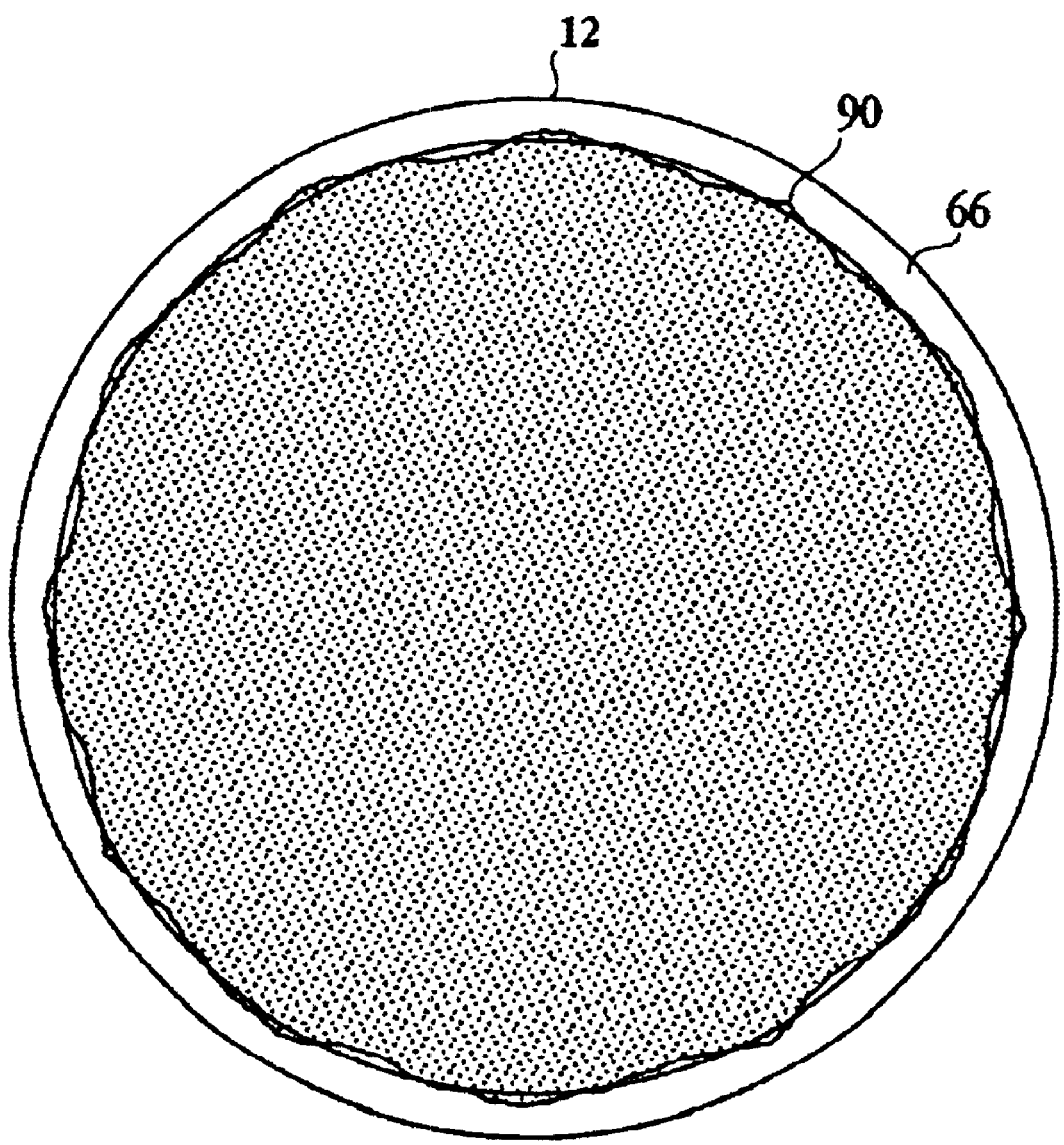
FIG. 1F shows a prior art erratic edge cleaning pattern.
Figure 2A:
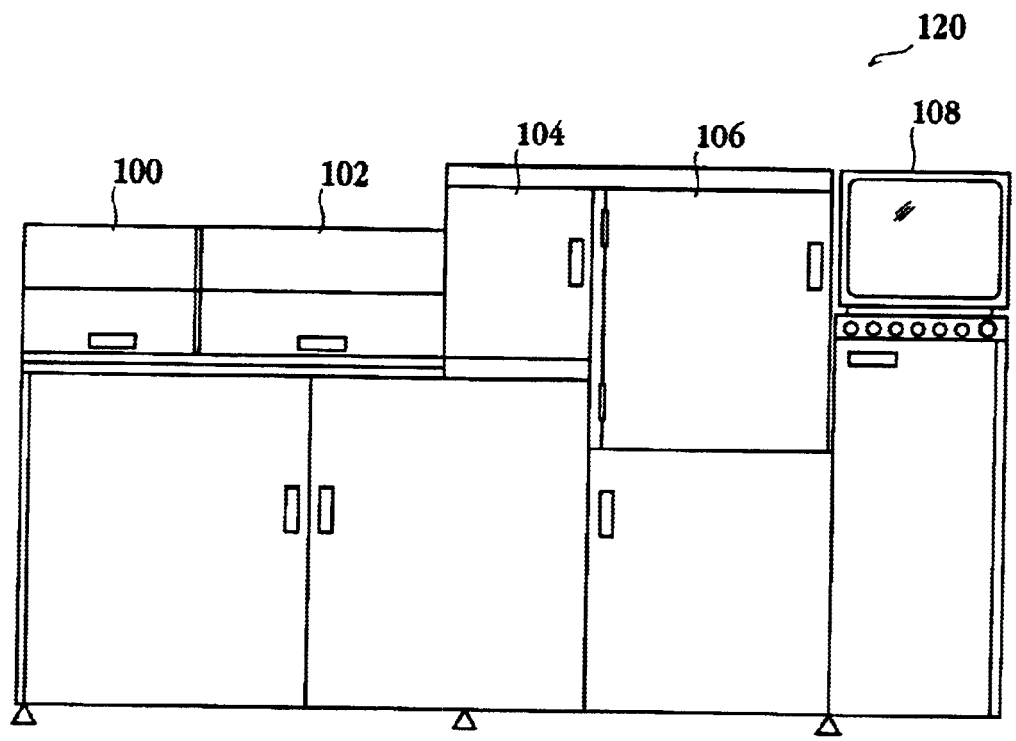
FIGS. 2A and 2B show a side view and a top view, respectively, of a cleaning system in accordance with one embodiment of the present invention.
Figure 2B:
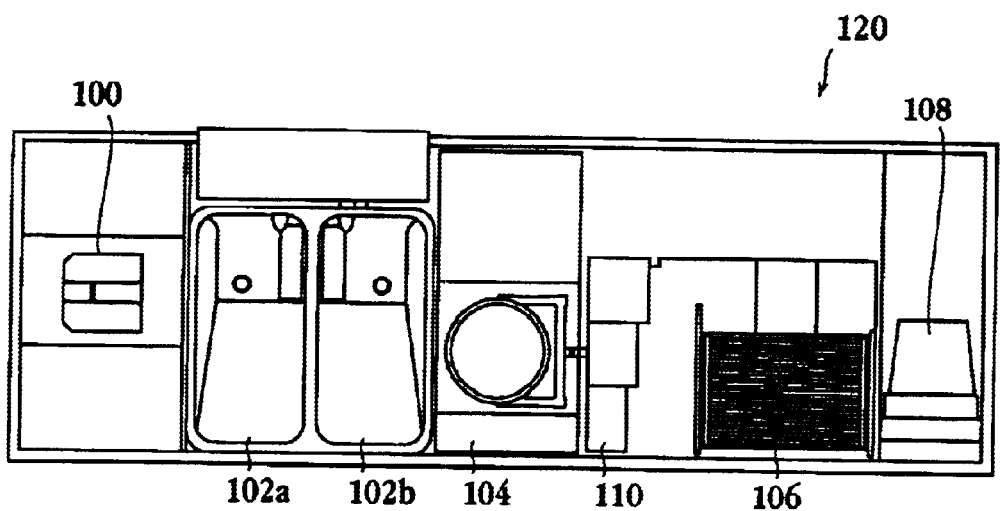

FIGS. 2A and 2B show a side view and a top view, respectively, of a cleaning system 120 in accordance with one embodiment of the present invention. The cleaning system 120 typically includes an input station 100 where a plurality of wafers may be inserted for cleaning through the system. Once the wafers are inserted into the input station 100, a wafer may be taken from the input station 100 and moved into a brush box one 102a, where the wafer is scrubbed with selected chemicals and water (e.g., de-ionized water) before being moved to a brush box two 102b. As will be described below, each of the brush boxes 102 can include an edge cleaning apparatus, such as one or more edge scrubbing rollers. The edge cleaning apparatus is configured to apply mechanical scrubbing to an edge region of the wafer as well as surface regions along the periphery of the wafer. The edge cleaning apparatus can be configured to simultaneously apply different amounts of pressure on the front side and the back side of the wafer. The edge cleaning apparatus and can be configured with accompanying spray nozzles, misters or fluid applicators to further assist in the scrubbing.

After the wafer has been scrubbed in the brush boxes 102, the wafer is moved into a spin, rinse, and dry (SRD) station 104, where de-ionized (DI) water is sprayed onto the surface of the wafer and spun to dry. After the wafer has been placed through the SRD station 104, an unload handler 110 takes the wafer and moves it into an output station 106. The cleaning system 120 is configured to be programmed and controlled from system electronics 108.

Figure 2C:
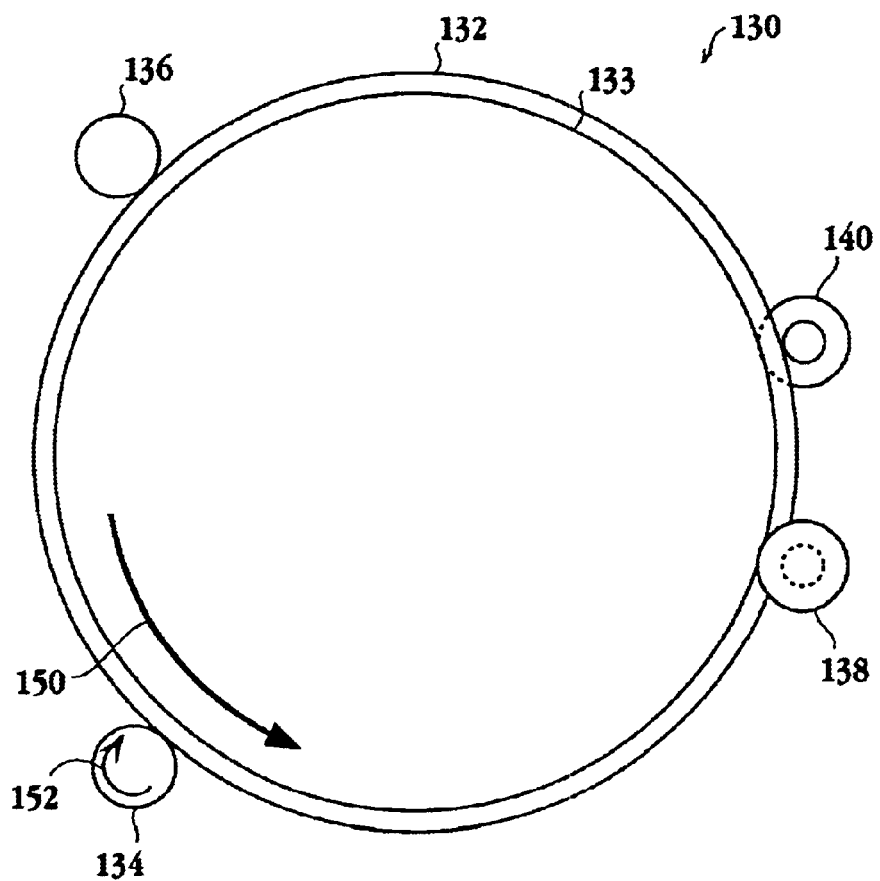
FIGS. 2C and 2D show a wafer edge cleaning apparatus in accordance with one embodiment of the present invention.
Figure 2D:
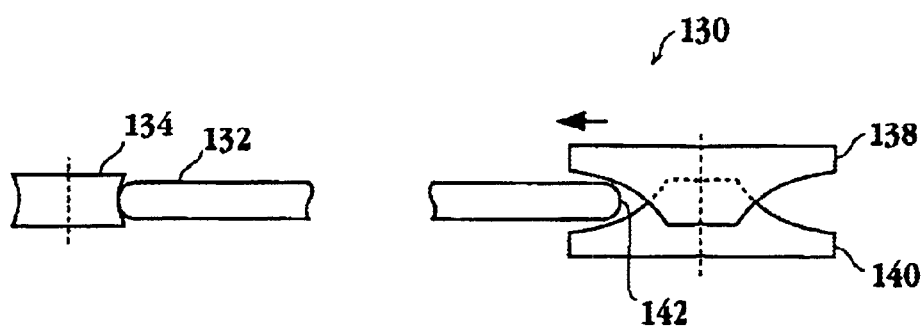
Figure 3:
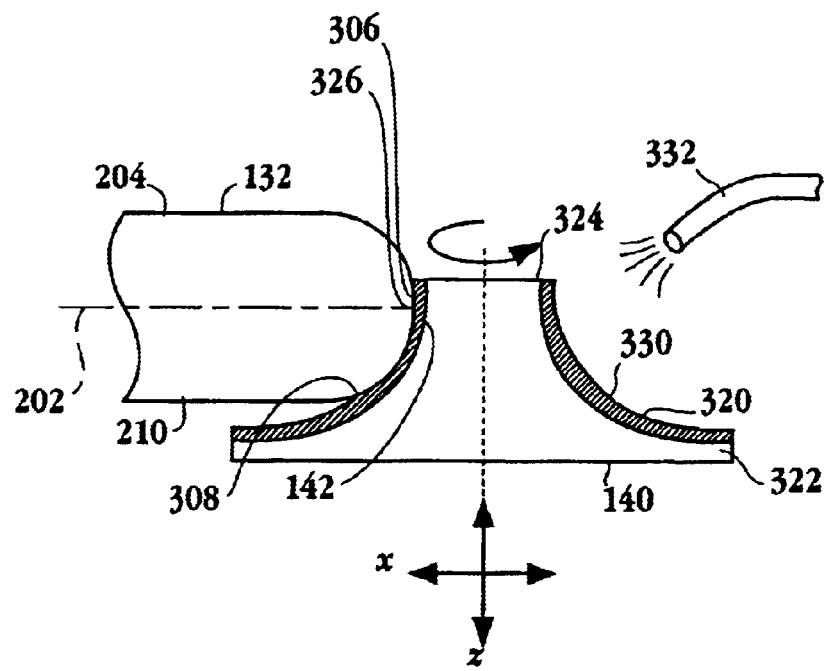
FIGS. 3 and 4 are a side view of the back side edge cleaning rollers as it contacts the wafer, in accordance with one embodiment of the present invention.

FIG. 2C is a top view of a wafer edge cleaning apparatus 130 in accordance with one embodiment of the present invention. FIG. 2D is a side view of the wafer edge cleaning apparatus 130 in accordance with one embodiment of the present invention. Wafer edge cleaning apparatus 130 includes a wafer 132 that is held by edge rollers 134, 136 and two edge cleaning rollers 138 and 140. Fewer or more edge cleaning rollers and edge rollers could also be used. The edge rollers 134, 136 can include a drive roller 134 and a stator roller 136. Each of the edge cleaning rollers 138, 140 clean one portion of the bevel edge of the wafer 132 and an exclusion area (i.e., zone) on one side of the wafer 132. By way of example, edge cleaning roller 140 is the back side edge cleaning roller and contacts the wafer 132 at a back portion of the bevel edge and can also contact the exclusion zone on the back side of the wafer 132. FIG. 3 below shows a more detailed side view of the back side edge cleaning roller 140.

In one embodiment, the edge cleaning rollers 138 and 140 can have the same diameter. Alternatively, the edge cleaning rollers 138 and 140 can have different diameters. The edge cleaning rollers 138, 140 are driven against the edge of the wafer 132 so as to scrub the bevel edge 142 of the wafer 132 and the edge exclusion zones on the respective sides of the wafer 132 as will be described in more detail below.

The wafer 132 rotates in a direction 150, which is driven in direction 120 by drive roller 134, which is rotating in direction 152. The wafer 132 could also rotate in an opposite direction from direction 152. The stator roller 136 can also be driven in direction 152. Otherwise, the stator roller 136 acts as an idler and supports the edge of the wafer 132. The edge cleaning rollers 138, 140 can rotate in the direction 152 or alternatively in the reverse direction so as to scrub against the bevel edge 142 of the wafer 132. The edge cleaning rollers 138, 140 can also rotate at a faster or a slower speed than the drive roller 134 so as to produce a tangential differential speed with the wafer bevel edge 142. The edge cleaning rollers 138, 140 can also operate at different speeds and directions, and in a direction opposing the direction of the wafer 132, if desired. The edge cleaning rollers 138, 140 can also be operated (e.g., rotated, moved up, down, toward and away from the wafer 132, independently of each other. The drive roller 134, stator roller 136, and the edge cleaning rollers 138, 140 can be the same or different sizes.(e.g., diameters, thicknesses, etc.)

Figure 2E:
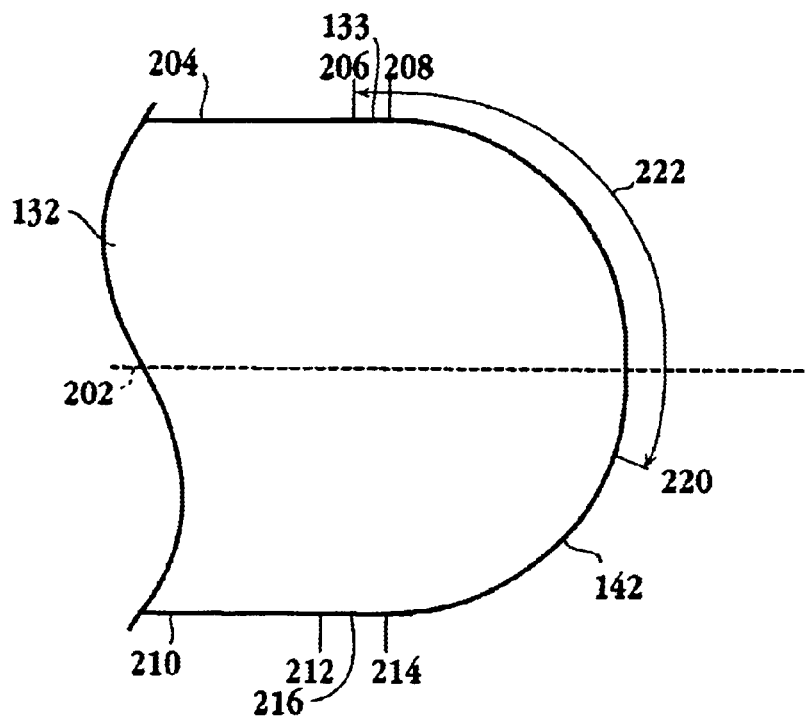
FIG. 2E shows a contact region of the front side edge cleaning roller in accordance with one embodiment of the present invention.
Figure 2F:
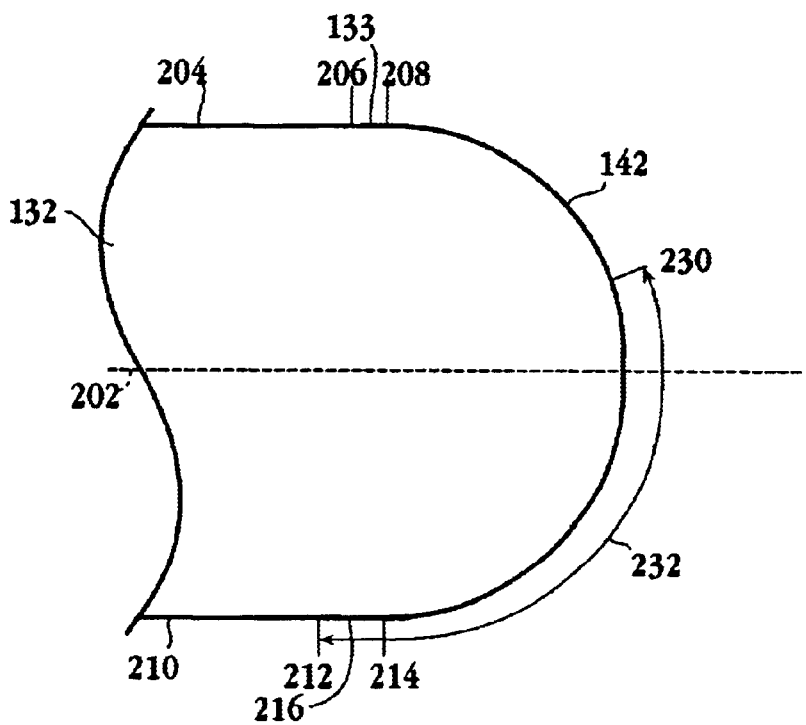
FIG. 2F shows a contact region of the back side edge cleaning roller in accordance with one embodiment of the present invention.

FIG. 2E shows a contact region 222 of the front side edge cleaning roller 138 in accordance with one embodiment of the present invention. FIG. 2F shows a contact region 232 of the back side edge cleaning roller 140 in accordance with one embodiment of the present invention. The wafer 132 is shown with a centerline 202, a front surface (side) 204, a back side 210, a front side edge exclusion zone 133 between points 206 and 208, and a back side edge exclusion zone 216 between points 212 and 214. The front side edge cleaning roller 138 can contact the bevel edge 142 and the front side edge exclusion zone 133 within a first portion 222 of the bevel edge 142 that extends from an inner edge 206 of the front side edge exclusion zone 133 to a point 220 that is substantially beyond the center line 202 of the wafer 132. Point 220 can be anywhere between the center line 202 and the point 214. Point 214 is the beginning of the back side 210 of the wafer 132.

The back side edge cleaning roller 140 can contact the bevel edge 142 and the back side edge exclusion zone 216 within a second portion of the bevel edge 232 that extends from an inner edge 212 of the back side edge exclusion zone 216 to a point 230 that is substantially beyond the center line 202 of the wafer 132. Point 230 can be anywhere between the center line 202 and the point 208. Point 208 is the beginning of the front side 204 of the wafer 132.

FIG. 3 is a side view of the back side edge cleaning roller 140 as it contacts the wafer 132, in accordance with one embodiment of the present invention. The edge cleaning roller 140 has a polymer surface 320 such as a polyurethane pad or other cleaning surfaces as will be described in more detail below. More importantly, the edge cleaning roller 140 has a curved surface 330 that extends from the outside edge 322 to the top of the roller 324. The exact curvature of the curved surface 330 is dependent upon a number of factors. One factor can be the shape of the particular beveled edge 142 of the wafer 132 in that the selected curvature of the curved surface 330 can be chosen to match the particular bevel of the wafer 132. Alternatively, the curvature of the curved surface 330 can be a more standard curve or universal curve that is capable of deforming to contact several shapes of beveled edges of various wafers.

Figure 4:
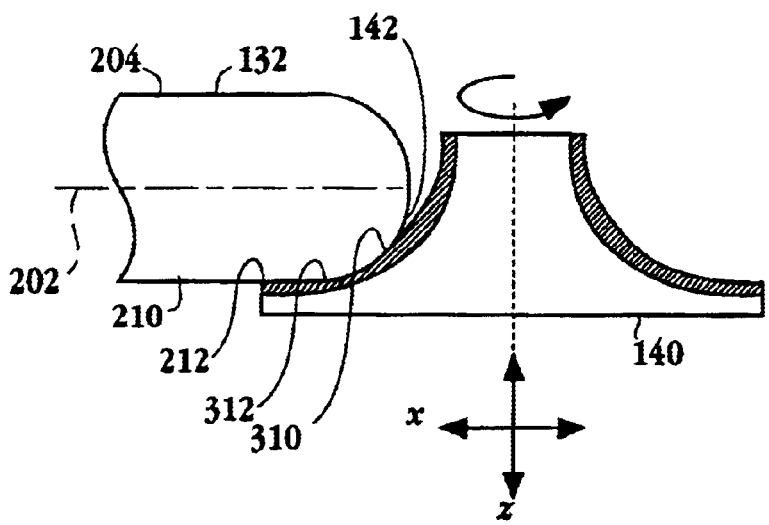

As shown in FIG. 3, the back side edge cleaning roller 140 is in contact with the wafer 132 between point 306 and point 308 of the beveled edge 142 of the wafer 132. The polymer surface 320 is compressed between points 306 and 308. As shown in FIG. 4, the edge cleaning roller 140 is adjusted in the Z-axis relative to the position of the wafer 132. As a result the contact area shifts to between positions 310 and 312 on the wafer 132. Moving the edge cleaning roller 140 can also compress the polymer surface 320 varying amounts so that the polymer surface 320 can conform to the precise curvature of the bevel edge 142. Additional movements in either the Z or the X axes of the edge cleaning roller 140 can further shift the particular contact area with the wafer 132 and therefore shift the region of the bevel edge 142 and/or the back side exclusion zone 216 of wafer being cleaned (i.e., the cleaning region) the second portion 232 shown in FIG. 2F above. As a result by slightly shifting or adjusting the cleaning pressure and/or location of the edge cleaning roller 140 in either the X or the Z-axes, the particular contact area between the wafer 132 and the edge cleaning roller 140 is shifted thereby providing specific control of the cleaning of the edge of the wafer 132.

As shown in FIGS. 3 and 4 the back side edge cleaning roller 140 is shown but simply inverting the illustrated embodiments will result in the similar application of a front side cleaning roller such as roller 138 in FIG. 2A.

The edge cleaning rollers 138, 140 are not closed off like the U-shaped edge cleaners in the prior art and as a result, the edge cleaning surface (e.g., polymer surface 320) is exposed and open so that the edge cleaning surface can be readily rinsed by a directional nozzle 332. The nozzle 332 (as shown in FIG. 3) can wash the side of the edge cleaning roller 140 that is away from the wafer 132 as the edge cleaning roller 140 rotates away from the wafer 132. The edge cleaning rollers 138, 140 can therefore be rinsed much more completely than the prior art edge cleaning systems. Improved rinsing of the edge cleaning rollers 138, 140 significantly reduces the opportunity for cross contamination from one wafer to another wafer.

Different portions of the wafer 132 can be cleaned by each of the respective edge cleaning rollers 138, 140 because the front side edge cleaning roller 138 and the back side edge cleaning roller 140 are separate rollers. By way of example, often the front side exclusion zone 133 is as narrow as one or two millimeters in width, inward from the beveled edge 142 of the wafer 132. As a result, it would he less desirable for the front side edge cleaning roller 138 to clean more of the front side 204 than the front edge exclusion zone 133 (e.g., more than two millimeters into the wafer 132) as that would include cleaning into the area of active devices on the front side 204 of the wafer 132. Cleaning active devices on the front side 204 could potentially damage the active devices or at least subject the active devices to unnecessary cleaning.

The back side 210 of the wafer 132 is handled by several different wafer handling systems that transport the wafer 132 between manufacturing processes. The several wafer handling systems can also transfer undesirable matter (i.e., dust, grit, chemicals and other contaminants) to the back side 210. Furthermore, residues may be deposited on a portion of the back side of the wafer that overhangs a wafer chuck in an etch process module during an etch process. These back side residues must be removed prior to subsequent operations (e.g., deposition process). As a result, the back side 210 can have a much wider edge region 216 needing to be cleaned. Therefore, the back side of the wafer 132 may need to be cleaned 5 or even 10 millimeters inward from the bevel edge 142 where the front side requires only 1 millimeter inward from the bevel edge 142 to be cleaned. The front side edge cleaning roller 138 can be a different size (i.e., diameter) or shape (i.e., different curved cleaning surface) than the back side edge cleaning roller 140 so as to aid in cleaning on the desired cleaning regions of the respective sides of the wafer 132.

For the above reasons, separating the front side edge cleaning apparatus from the back side edge cleaning apparatus provides a significant advantage over prior art wafer edge cleaning systems, methods and apparatus. Further, because the front side edge cleaning apparatus is separate from the back side edge cleaning apparatus, different cleaning chemistries can be used on each side of the wafer 132. Different cleaning chemistries are typically used to remove different materials. The separate edge cleaning rollers 138, 140 can therefore yield different cleaning results on the respective sides of the wafer 132. By way of example, DI water may be applied on the front side edge cleaning roller 138 while a stronger chemistry (i.e., HF) is applied to the back side edge cleaning roller 140.

Separating the front side edge cleaning apparatus from the back side edge cleaning apparatus also allows other differences in the respective cleaning operations. For example, each of the edge cleaning rollers 138, 140 can be operated at different rotational speeds or different scrubbing pressures or different contact areas. While the various embodiments shown above include both front side and back side edge cleaning in one brush box, in an alternative embodiment, the front side edge cleaning can be exclusively provided in a separate brush box from another brush box for back side edge cleaning.

As described above in FIGS. 2E–4, the particular cleaning contact interaction can be scanned or adjusted along the respective contacting portions 222, 232 between the edge cleaning roller 138, 140 and the wafer 132 as the pressure or the direction of the edge cleaning roller 138, 140 is changed, respective to the wafer 132. The edge cleaning rollers 138, 140 can be moved either horizontally (i.e., X-axis) or vertically (i.e. Z-axis) to adjust the location, area, pressure and other aspects of the contact interaction between the edge cleaning roller 138, 140 and the wafer 132.

Figure 5:
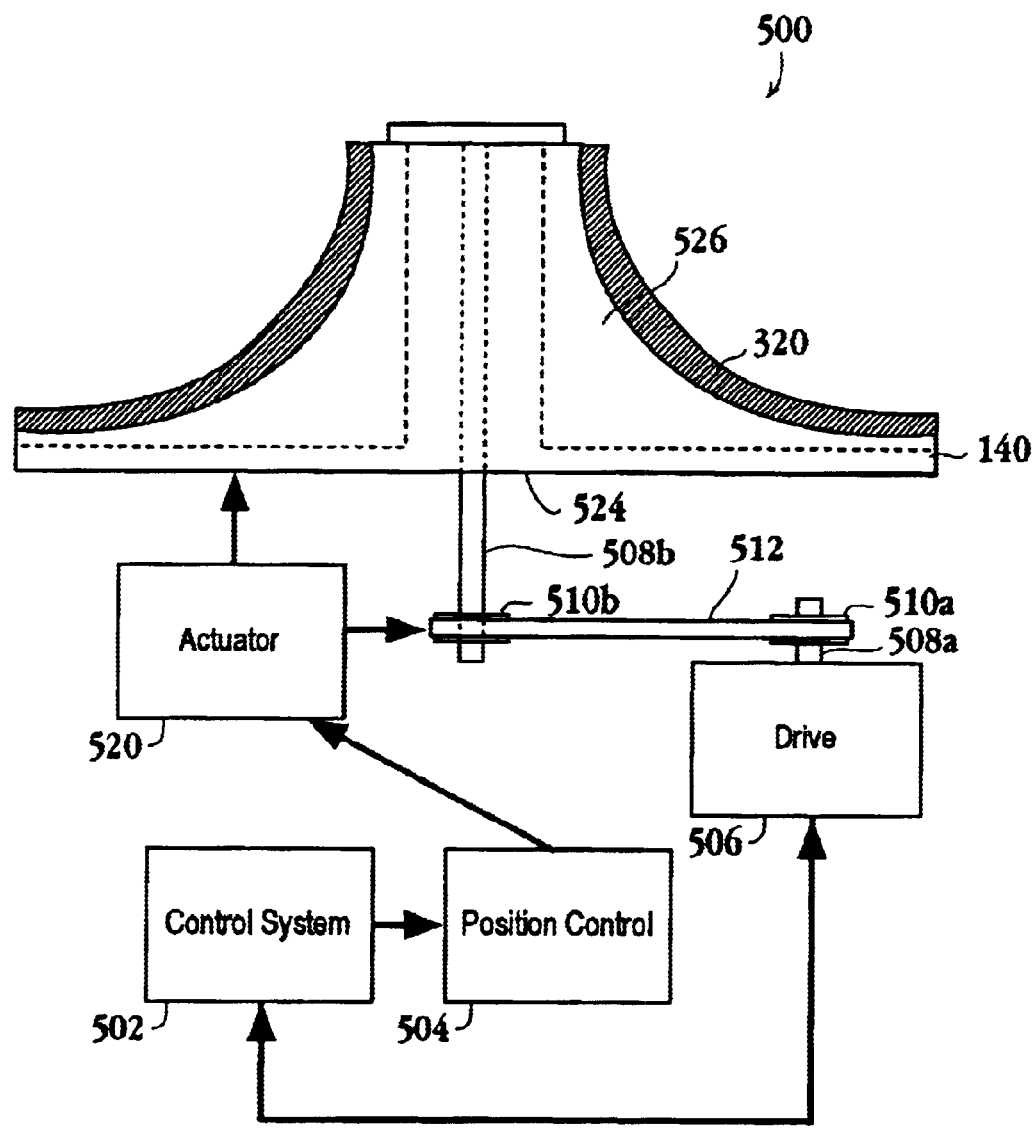
FIG. 5 shows a system for controlling edge cleaning roller and a cross-sectional view of the edge cleaning roller, in accordance with one embodiment of the present invention.

FIG. 5 shows a system 500 for controlling edge cleaning roller 140 and a cross-sectional view of the edge cleaning roller 140, in accordance with one embodiment of the present invention. The system 500 includes a control system 502 that is linked to a position controller 504 and a drive mechanism 506. The drive mechanism 506 is mechanically coupled to the edge cleaning roller 140 such as through shafts 508A, 508B, pulleys 510A, 510B and a drive belt 512 so that the drive mechanism 506 can rotate the edge cleaning roller 140. Other mechanisms could also be used instead of the shafts 508A, 508B, pulleys 510A, 510B and a drive belt 512 to couple the drive mechanism 506 and the edge cleaning roller 140. The drive mechanism 506 can be the same or separate from the drive mechanisms that drive other portions of the wafer edge cleaning apparatus (e.g., wafer edge cleaning apparatus 130 shown in FIGS. 2C and 2D above) such as other edge cleaning rollers 138 or the drive roller 134. The control system 502 controls the drive mechanism 506 so that the edge cleaning roller 140 can be driven at a desired rate and direction.

The position controller 504 is linked to an actuator 520. The actuator 520 can be used to move the roller 140 in the Z-axis or the X-axis. The control system 502 controls the actuator 520 through the position controller 504. The actuator 520 can be a stepper motor or a screw or any other method providing fine control to move the edge cleaning roller 140 very precisely controlled amounts so that the edge cleaning roller 140 can be adjusted to scan the respective contact portion 222, 232 of the wafer 132 as described above.

The polymer surface 320 of the edge cleaning roller 140 can be any suitable wafer cleaning pad materials such as polyurethane, subaIV, felt, mohair and other types of suitable pad materials. The polymer surface 320 can be formed directly on the edge cleaning roller 140 or sprayed on or polymerized directly on the edge cleaning roller 140. In one embodiment the edge cleaning roller 140 can be manufactured in multiple parts. By way of example the driven part 524 (i.e., the center part) of the edge cleaning roller 140 as shown in FIG. 5, can be a more solid long wearing and durable portion (e.g., PET, metal, rubber, etc) that is generally impervious to the cleaning chemistries to be used. A flexible portion 526 (e.g., softer, more flexible and compressible materials) can be placed on top of the driven portion 524 and the polymer surface scrubbing pad 320 can be placed on the flexible portion 526. The materials for the surface scrubbing pad 320 and the flexible portion 526 can be selected to meet a desired amount of flexing and compressing so as to deform around the edge of the wafer as desired. When the surface scrubbing pad 320 and the flexible portion 526 are worn and no longer suitable for use, they could also be easily removed and replaced from the driven part 524.

The edge cleaning rollers 138, 140 in varying embodiments can have a base diameter (i.e., the widest portion) from between about ¼ inch to as big as about 4 inches. The base diameter can be between about 1 and about 3 inches or between about 1¼ to about 2 inches. The top (i.e., the small portion) of the edge cleaning rollers 138, 140 is typically in a range of about ⅛ inch to about 3 inches. The top can also be between about ¼ inch and about 2 inches or about ½ inch in diameter. The cleaning pad 320 can be any thickness required. The thickness of the cleaning pad 320 depends on the type of material the cleaning pad 320. For example in SubaIV pads are typically in a range of about 0.010 inch and about 0.150 inch. Other cleaning pads 320 can be within a range of about 0.020 inch to about 0.100 inch and in one embodiment is 0.050 inch.

Figure 6:
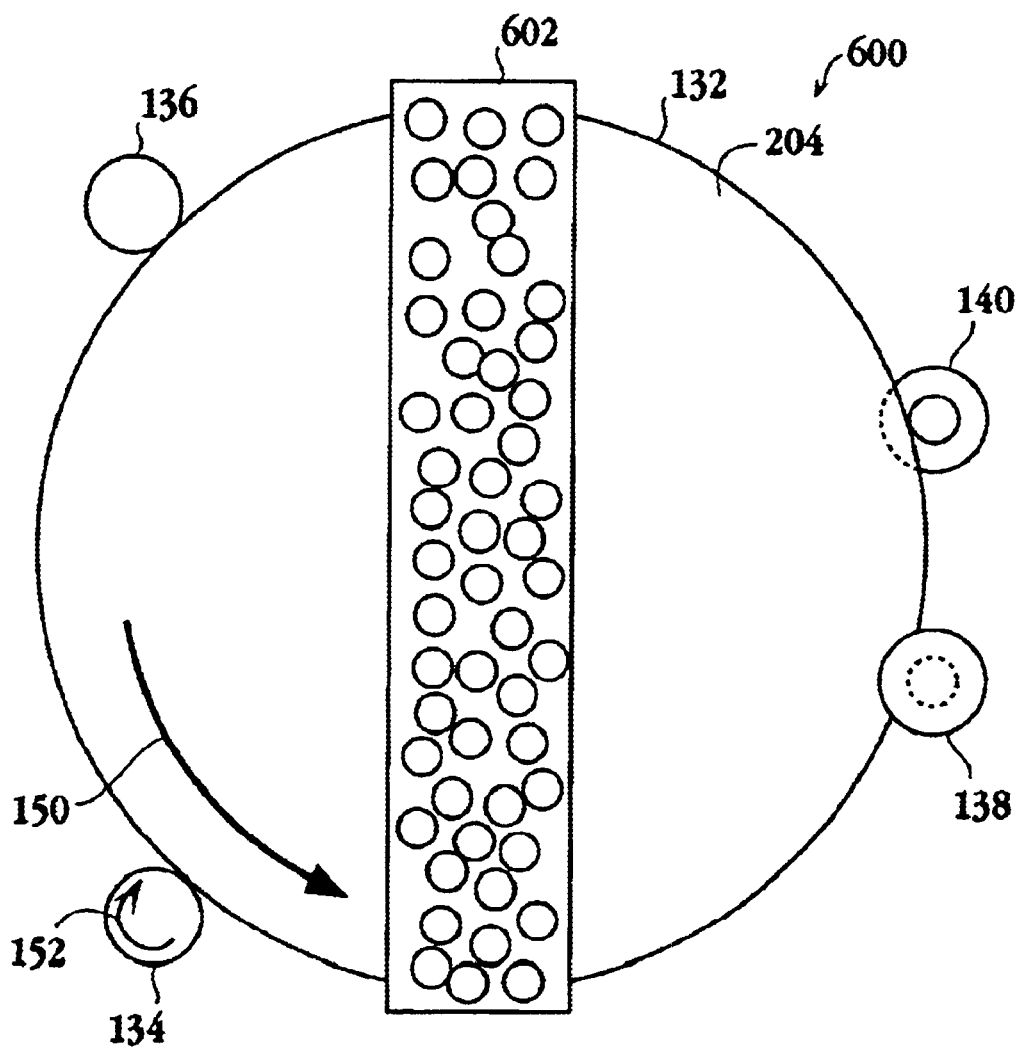
FIG. 6 shows a brush box in accordance with one embodiment of the present invention.

FIG. 6 shows a brush box 600 in accordance with one embodiment of the present invention. The brush box 600 includes a one or more surface cleaning brushes 602 that clean one or more surfaces 204, 210 of the wafer 132 as the wafer is rotated by the drive roller 134 and supported by the stator roller 136 and the edge cleaning rollers 138 and 140. The edge cleaning rollers 138 and 140 clean the bevel edge 142 and adjacent regions of the wafer 132 while the surface 204, 210 of the wafer 132 is being cleaned by the surface brush 602. The surface brush 602 can also drive or push the wafer 132 into the edge cleaning rollers 138 and 140.

In one embodiment, the edge cleaning rollers 138, 140 are located very close together so as to minimize any torque or twisting that may result from having the edge cleaning rollers 138, 140 separated. While only the four edge rollers 138, 140, 136 and 134 are shown additional edge rollers could be used to provide additional stability and support for the wafer 132. In another embodiment, the stator and drive rollers 134, 136 can be omitted and the wafer 132 supported between two surface cleaning brushes: a front side cleaning brush 602 and a back side cleaning brush (hidden).

Figure 7:
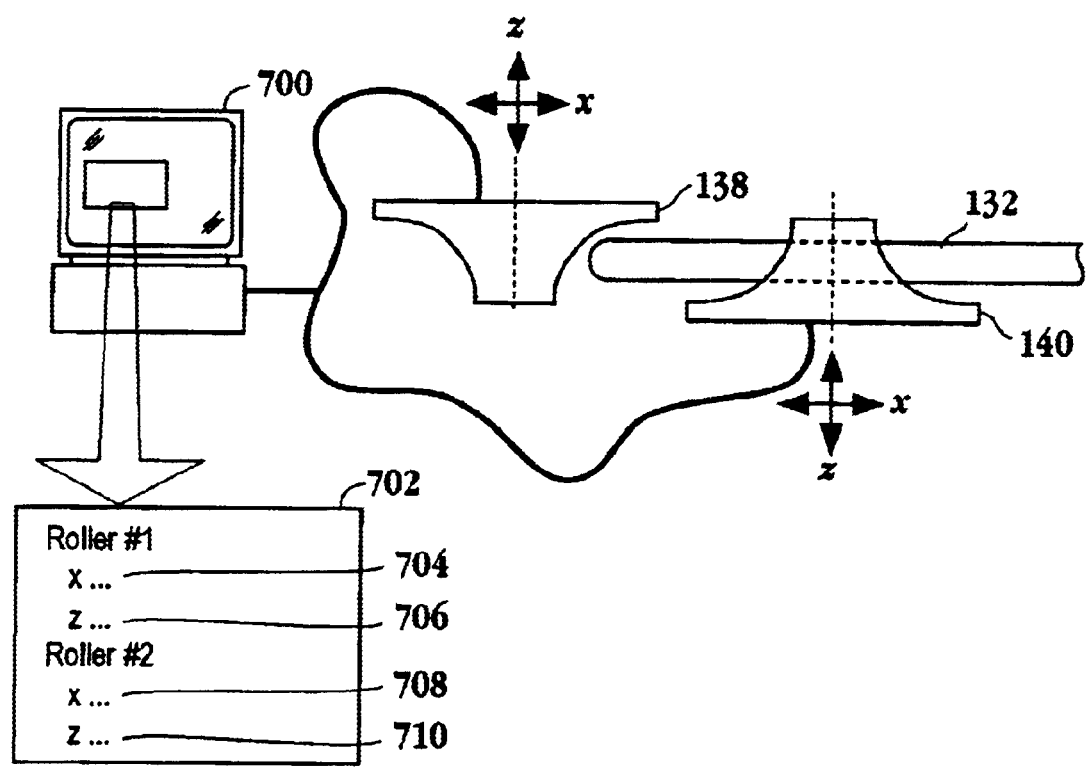
FIG. 7 shows control system for an edge cleaning apparatus in accordance with one embodiment of the present invention.

FIG. 7 shows a control system 700 for an edge cleaning apparatus in accordance with one embodiment of the present invention. The control system 700 includes a recipe 702 and parameters 704, 706, 708, 710 for each of the front side and the back side edge cleaning rollers 138, 140. The recipe 702 can define location (e.g., X and Z axes settings), rotational speed and direction, force applied, timing, and many other operational parameters for the edge cleaning rollers 138, 140.

Figure 8:
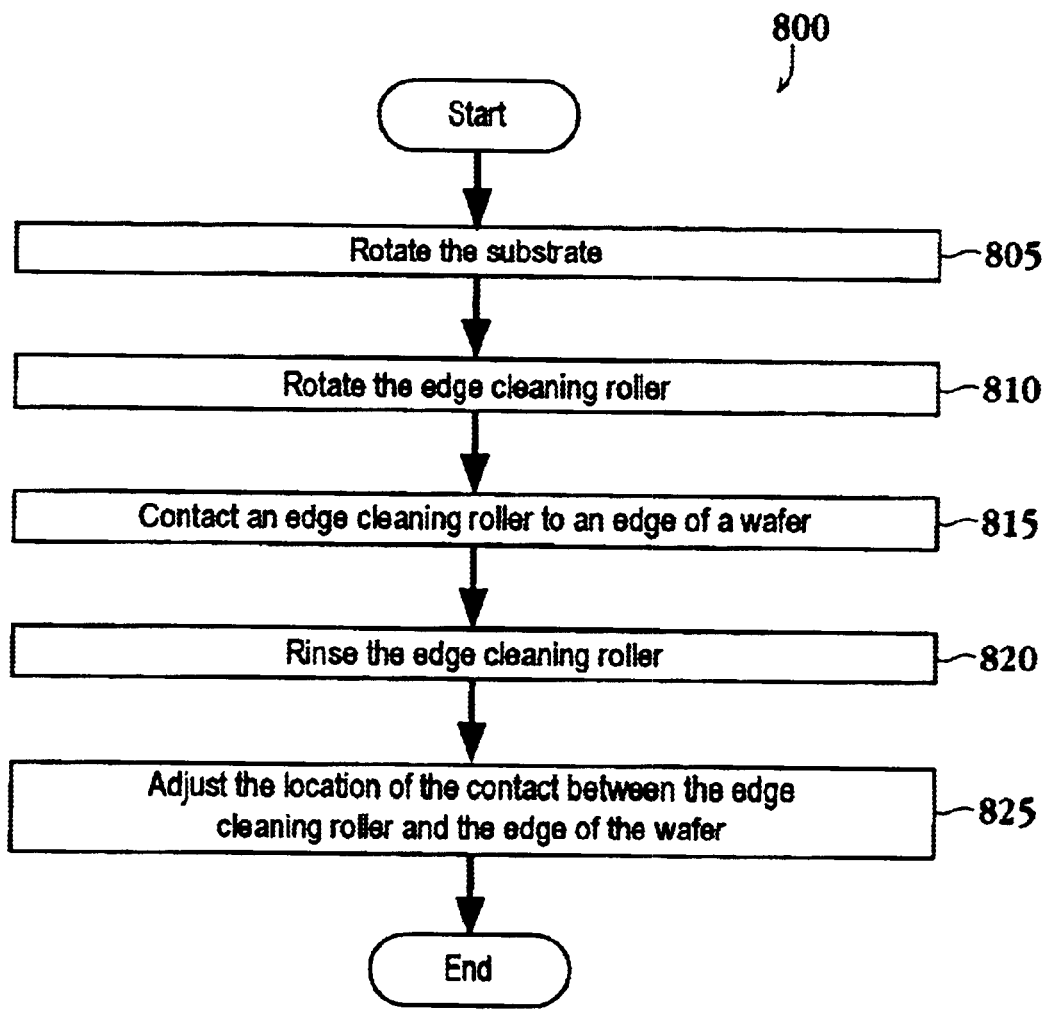
FIG. 8 is a flowchart of the method operations for cleaning the edge of a wafer in accordance with one embodiment of the present invention.

FIG. 8 is a flowchart of the method operations 800 for cleaning the edge of a wafer in accordance with one embodiment of the present invention. In operation 805, the wafer 132 is rotated relative to the edge cleaning roller 138, 140. The edge cleaning roller 138, 140 is also rotated in operation 810 relative to the edge of the wafer 132.

In operation 815, one or more edge cleaning rollers 138, 140 are brought into contact with an edge of the wafer 132.

The wafer 132 can be supported as between two side scrubbing brushes or between additional edge rollers such as described above in FIGS. 2C and 6. The edge cleaning roller 138, 140 can be rotated at a velocity such that the tangential velocity of the edge cleaning roller 138, 140 is the same or different than the tangential velocity of the wafer 132 where the edge cleaning roller 138, 140 contacts the wafer 132. The differential tangential velocity allows the edge cleaning roller 138, 140 to scrub its surface against the wafer 132.

The edge cleaning roller 138, 140 can also be rinsed in operation 820, such as by dispensing a rinsing chemical from a nozzle 332 shown in FIG. 3 above. The rinsing nozzle 332 can also be used to dispense other chemicals (e.g., reactive chemicals) to the edge cleaning roller 138, 140 to aid in the cleaning action. In operation 825, the edge cleaning roller 138, 140 can also be adjusted so as to move the contact size and location between the edge cleaning roller 138, 140 and the edge regions of the wafer 132.

The separated edge cleaning rollers 138, 140 allow improved and more effective edge cleaning over the prior art edge cleaning systems, methods and apparatus. The dynamic adjusting of the individual separated edge cleaning rollers 138, 140 provides improved and more precise control of the edge cleaning process than the prior art edge cleaning systems, methods and apparatus.

As used herein in connection with the description of the invention, the term "about" means +/−10%. By way of example, the phrase "about 250" indicates a range of between 225 and 275.

With the above embodiments in mind, it should be understood that the invention might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can be thereafter be read by a computer system. Examples of the computer readable medium include hard drives, network attached storage (NAS), read-only memory, randomaccess memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in FIG. 8 are not required to be performed in the order illustrated, and that all the processing represented by the operations may not be necessary to practice the invention. Further, the processes described in FIG. 8 can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A substrate edge cleaning apparatus comprising:
   a substrate supporting device to substantially support a substrate in a selected plane the substrate having a circular shape and a circumferential edge, a front side and a back side, the edge having a bevel shaped cross-section;
   a first edge cleaning roller having an open curved scrubbing surface in contact with a first contact area consisting of at least part of a beveled first portion of the edge of the substrate, wherein the first contact area extends between an exclusion zone on the front side of the substrate approximately to a center line of the substrate but not on the back side of the substrate; and
   a second edge cleaning roller having an open curved scrubbing surface in contact with second contact area consisting of at least part of a beveled second portion the edge of the substrate, wherein the second contact area extends between an exclusion zone on the back side of the substrate approximately to a center line of the substrate but not on the front side of the substrate.

2. The apparatus of claim 1, wherein the first contact area and the second contact area can be adjusted dynamically.

3. The apparatus of claim 1, wherein the first edge cleaning roller coupled to a drive mechanism capable of driving the first edge cleaning roller causing the first edge cleaning roller to have a differential tangential velocity relative to the edge of the substrate.

4. The apparatus of claim 3, wherein the first edge cleaning roller is coupled to an actuator capable of dynamically adjusting a location of the first edge cleaning roller in at least one of an X-axis and a Z-axis, relative to the substrate.

5. The apparatus of claim 4, further comprising a control system including a recipe that defines a plurality of parameters of the first edge cleaning roller, the plurality of parameters including:
   the location of the first edge cleaning roller; and
   rotation of the first edge cleaning roller.

6. The apparatus of claim 1, further comprising at least one nozzle directed toward a side of the first edge cleaning roller opposite from the substrate.

7. A substrate cleaning system, comprising:
   a cleaning station, the cleaning station including,
      a substrate supporting device to substantially support the substrate in a selected plane;
      a first edge cleaning roller having an open curved scrubbing surface in contact with a first contact area consisting of at least part of a beveled first portion of the edge of the substrate, wherein the first contact area extends between an exclusion zone on a front side of the substrate approximately to a center line of the substrate but not on a back side of the substrate; and
      a second edge cleaning roller having an open curved scrubbing surface in contact with second contact area consisting of at least part of a beveled second portion the edge of the substrate, wherein the second contact area extends between an exclusion zone on the back side of the substrate approximately to a center line of the substrate but not on the front side of the substrate.

8. The substrate cleaning system of claim 7, wherein the substrate supporting device includes two side scrubbing brushes that support the substrate between the two side scrubbing brushes.

9. The substrate cleaning system of claim 7, wherein the substrate supporting device includes two or more edge rollers in contact with the edge of the substrate, the two or more edge rollers and the first edge cleaning roller are distributed around a circumference of the substrate to support the substrate.

* * * * *

UNITED STATES PATENT AND TRADEMARK OFFICE
CERTIFICATE OF CORRECTION

| | |
|---|---|
| PATENT NO. | : 6,910,240 B1 |
| APPLICATION NO. | : 10/321688 |
| DATED | : June 28, 2005 |
| INVENTOR(S) | : John M. Boyd, Fred C. Redeker and James P. Garcia |

It is certified that error appears in the above-identified patent and that said Letters Patent is hereby corrected as shown below:

On the title page item (75), line 2, Inventors: Correct the name of Fred C. Redecker, Fremont, CA (US), to read: Fred C. --Redeker--

Signed and Sealed this

Tenth Day of April, 2007

JON W. DUDAS
*Director of the United States Patent and Trademark Office*